United States Patent
Cheng

(10) Patent No.: US 7,567,468 B2
(45) Date of Patent: Jul. 28, 2009

(54) SELECTIVE DISCHARGING MEMORY CIRCUIT WITH REDUCED POWER CONSUMPTION

(75) Inventor: Chi-Ting Cheng, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 9 days.

(21) Appl. No.: 11/463,890

(22) Filed: Aug. 10, 2006

(65) Prior Publication Data
US 2007/0047351 A1    Mar. 1, 2007

(30) Foreign Application Priority Data
Aug. 30, 2005    (TW) .............................. 94129681 A

(51) Int. Cl.
*G11C 7/06* (2006.01)

(52) U.S. Cl. ................... 365/189.07; 365/203; 365/191

(58) Field of Classification Search ............ 365/189.07, 365/203, 191
See application file for complete search history.

(56) References Cited

U.S. PATENT DOCUMENTS

| | | | | |
|---|---|---|---|---|
| 6,600,672 B2 * | 7/2003 | Hayashi | ...................... | 365/104 |
| 6,975,528 B2 * | 12/2005 | Do | .............. | 365/94 |
| 7,042,245 B2 * | 5/2006 | Hidaka | ...................... | 326/34 |
| 7,042,750 B2 * | 5/2006 | Choo et al. | .................. | 365/104 |
| 7,126,866 B1 * | 10/2006 | Poplevine et al. | .......... | 365/203 |

* cited by examiner

*Primary Examiner*—Hoai V Ho
*Assistant Examiner*—Kretelia Graham
(74) *Attorney, Agent, or Firm*—Winston Hsu

(57) ABSTRACT

In memory array of a memory circuit, a discharging module and an auxiliary module are disposed on each column line. While accessing an objective memory unit on a column line of the memory, the memory unit discharges the corresponding row line of the objective memory unit according to a discharging signal and a column selective signal. When the objective memory unit is enabled, the voltage level of the corresponding column line is changed, if the voltage level reaches a threshold voltage level, the auxiliary module enhances the increment of the voltage level of the column line.

4 Claims, 6 Drawing Sheets

SELECTIVE DISCHARGING MEMORY CIRCUIT WITH REDUCED POWER CONSUMPTION

BACKGROUND OF THE INVENTION

1. Field of the Invention

The present invention relates to the field of memories, and more particularly, to a memory and a related method capable of decreasing power consumption and enhancing accessing efficiency.

2. Description of the Prior Art

In modern information society, documents and data are transmitted, managed, and stored in the form of electronic signals, for this reason, memory device and memory circuits capable of accessing data are widely used in various fields. For example, in the field of communication, read-only memories, which store data in a non-volatile manner, generally are disposed in communication chips of cell phones for storing codes utilized for processing signals or other necessary parameters and vectors.

As known by those skilled in the art, a plurality of memory units, each utilized for storing one bit of data, is disposed in a memory. The memory units are arranged in array having a plurality of row lines and a plurality of column lines intersecting respectively. Each memory unit represents one bit of data according to various circuit structures thereof. For example, a memory unit set to store "1" is built without a transistor whereas a memory unit set to store "0" has a transistor. Generally, one of the drain/source of the transistor is connected to a column line, another is grounded with a low voltage level, and the gate is connected to the row line.

A memory unit has a pre-charge circuit and a holding circuit for pre-charging the column line and maintaining the voltage level of the column line when accessing an objective memory unit.

When accessing an objective memory unit of a given column line, all of the column lines of the memory array are pre-charged to a high voltage level (for example, a positive bias voltage VDD) and the holding circuit is activated for maintaining the high voltage level of the column lines. The pre-charging is then stopped to enable the objective memory unit, as a result, the voltage level of the given column of the objective memory unit is changed according to the stored data. If the objective memory unit has no transistors and stores a digital bit "1", the high voltage level of the given column line (or bit line) is maintained by the holding circuit. If the objective memory unit has a transistor and stores a digital bit "0", the transistor is turned on to discharge the column line to a ground voltage. According to the voltage level of the given column line, a sense amplifier reads out the data stored in the objective memory unit. An accessing cycle (or a reading cycle) is thus regarded as from the pre-charging to the data reading.

However, the conventional memory has some disadvantages. When accessing an objective memory unit, the conventional memory has to pre-charge all of the column lines, so that a great power is consumed. Otherwise, if the objective memory unit has a transistor, the holding circuit will work against the transistor of the objective memory unit. As mentioned above, in order to correctly read out the data, the memory units having transistors need to discharge the column lines through conduction transistors. However, since the column lines have been pre-charged to the high voltage level, the transistors of memory units pull down the voltage level of the column lines to ground after certain time of conduction. Unfortunately, for maintaining the voltage level of the column line, the holding circuit must work against the discharging of the memory unit, and thus, the memory unit spends much more time on discharging. In other words, the accessing cycle of the conventional memory is relatively long, which results in a low accessing efficiency.

SUMMARY OF THE INVENTION

The present invention provides a memory circuit includes at least one memory unit arranged in array, a discharging module, an auxiliary module and a sense amplifier. Each memory unit has a corresponding column line and row line. The discharging module is connected to the corresponding column line for discharging the column line of an objective memory unit. The auxiliary module is connected to the discharging module. The sense amplifier is connected to the auxiliary module for accessing data stored in the memory unit by detecting an electrical level of the column line of the memory unit. The memory circuit discharges the corresponding column line of the objective memory unit according to a discharging signal and a column selective signal. When the objective memory unit is enabled, the voltage level of the corresponding column line is changed, and if the voltage level reaches a threshold voltage level, the auxiliary module enhances the increment of the voltage level of the column line.

The present invention provides a selectivity discharging memory circuit includes a plurality of memory units arranged in array, and a plurality of discharging module. Each memory unit has a corresponding column line and row line. The discharging modules are connected to the corresponding column line, receiving a discharging signal and a column selective signal. The column line of an objective memory unit is discharged according to the discharging signal and the column selective signal.

The present invention provides a method for selective discharging a memory. The memory has a plurality of memory unit arranged in array. Each memory unit has a corresponding row line and column line. The method includes: enabling a discharging signal; and decoding the column line of an objective memory and enabling a corresponding column selective line of the column line; wherein discharging the column line of the objective memory unit when both of the discharging signal and the corresponding column selective signal are enabled.

The present invention provides a method for accessing a memory. The memory has a plurality of memory units arranged in array, and each memory unit has a corresponding column line and row line. The method includes: decoding and discharging the column line of an objective memory unit, decoding the column line of the objective memory unit and enabling the memory unit through the column line to change the voltage level of the column line of the objective memory unit, accessing the objective memory unit according to the voltage level of the column line, and turning on a driving unit for enhancing the increment of the voltage when the voltage level of the column line reaches a threshold voltage level.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
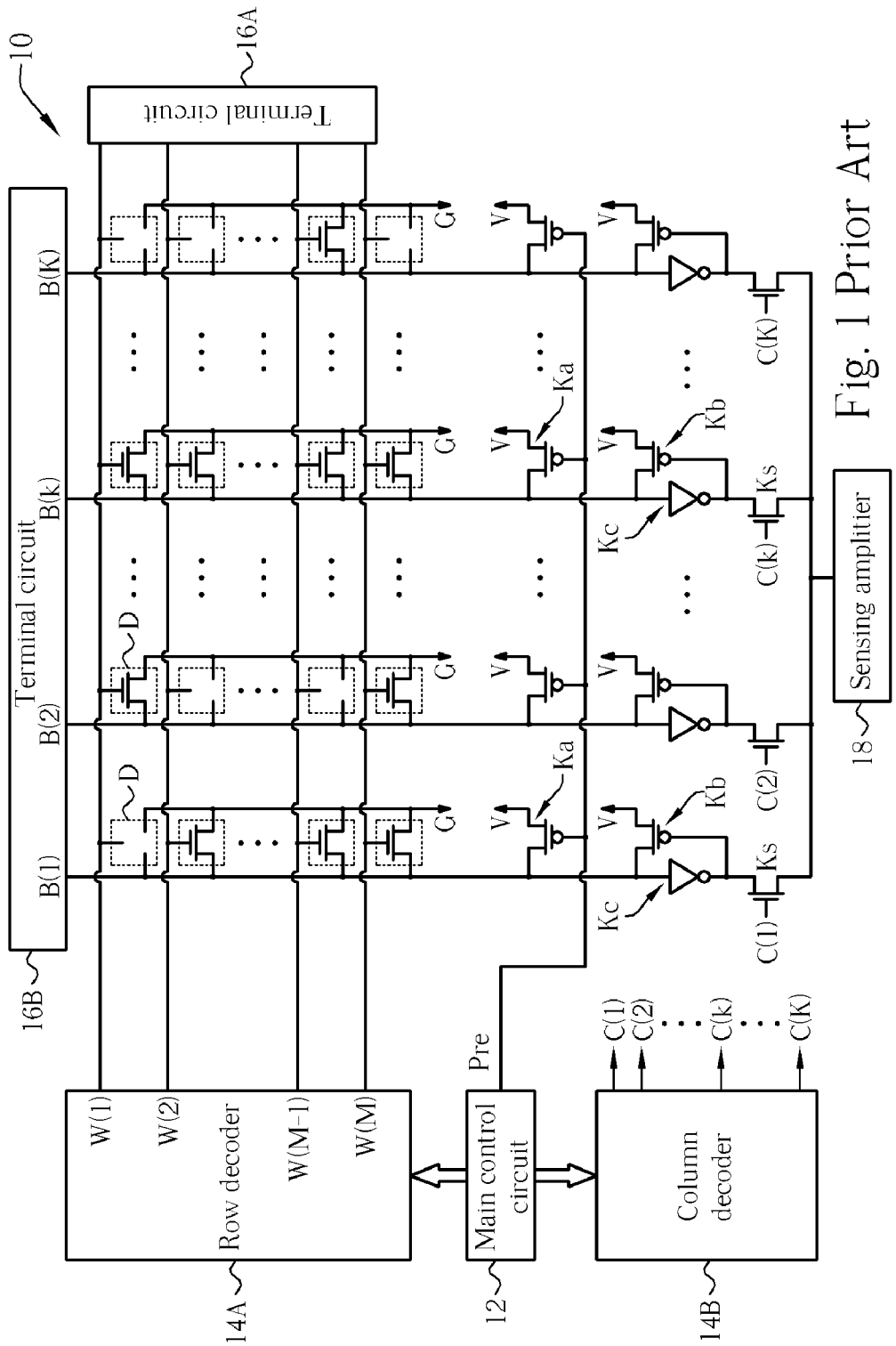
FIG. 1 is a diagram of a conventional memory circuit.

FIG. 1 is a diagram of a conventional memory circuit 10. The memory units are arranged in array, each memory unit D has a corresponding row line and column line respectively which represents one bit of data. The memory units are arranged in array by intersecting the row lines (or the word lines) W(1), . . . , W(M) and the column lines (or the bit lines) B(1), . . . , B(K). The memory circuit 10 further includes a mastering circuit 12, a column decoder 14B, a row decoder 14A, two terminal circuits 16A and 16B, and a sense amplifier 18. In addition, each of column line has two p-type metal oxide semiconductors Ka and Kb, an inverter Kc, and an N-type metal oxide semiconductor Ks utilized as a switch. The memory circuit 10 is biased between a high voltage V (e.g. a positive voltage VDD), and a low voltage G (e.g. a ground voltage). The mastering circuit 12 controls the operations of the memory circuit 10 and provides a pre-charging signal Pre to control pre-charging timing. Both the terminal circuits 16A and 16B have dummy cells, impedance matching circuits, and biasing circuits, for supporting the related circuits of the memory array.

As shown in FIG. 1, data of each memory unit are programmed depending on whether an N-type metal oxide semiconductor transistor existed or not. For example, data of a memory unit built without a transistor is set to be "1", whereas data of a memory unit with a transistor is set to be "0". In each memory unit D of the memory circuit 10, the drain and the source of the metal oxide semiconductor transistor respectively connected between a corresponding column line and a ground voltage G, and the gate is connected to a corresponding row line and selected by the row decoder. Switch Ks, for example: transistors, are respectively disposed on each column lines B(1)~B(K). The gate of each transistors Ks on each column lines B(1)~B(N) are respectively connected to the column decoder 14B and selected by the corresponding signals C(1)~C(K). The voltage level of each column lines B(1)~B(K) are sensed by the sense amplifier 18 depending to whether the corresponding switch is conducted by the corresponding signal C(1)~C(K) or not.

A transistor Ka on a column line B(1)~B(K) is regarded as a pre-charging circuit; A transistor Kb and a inverter Kc are regarded as a holding circuit. When the source of the transistor Ka is biased at a high bias voltage V, the gate of the transistor Ka is controlled by the signal Pre. When the transistor Ka is conducted, the corresponding column line is charged through the drain of the corresponding transistor Ka. The inverter Kc of the corresponding column line controls the corresponding transistor Kb according to the inverse drain voltage of the corresponding transistor Ka.

Assume that the voltage level of a given column line (i.e., the voltage level at the drain of the corresponding transistor Ka, that is, the voltage level of the node between the given column line and the objective memory unit) is maintained at a high voltage level, the corresponding inverter Kc controls the corresponding transistor Kb by a low voltage level, thus the transistor Kb is conducted and maintains the voltage level of the given column line at high voltage level. Once the voltage level of the given column line is dropped to a certain low degree, the corresponding inverter Kc controls the corresponding transistor Kb by a high voltage level, thus the transistor is disabled to affect the voltage level of the given column line.

Figure 2:
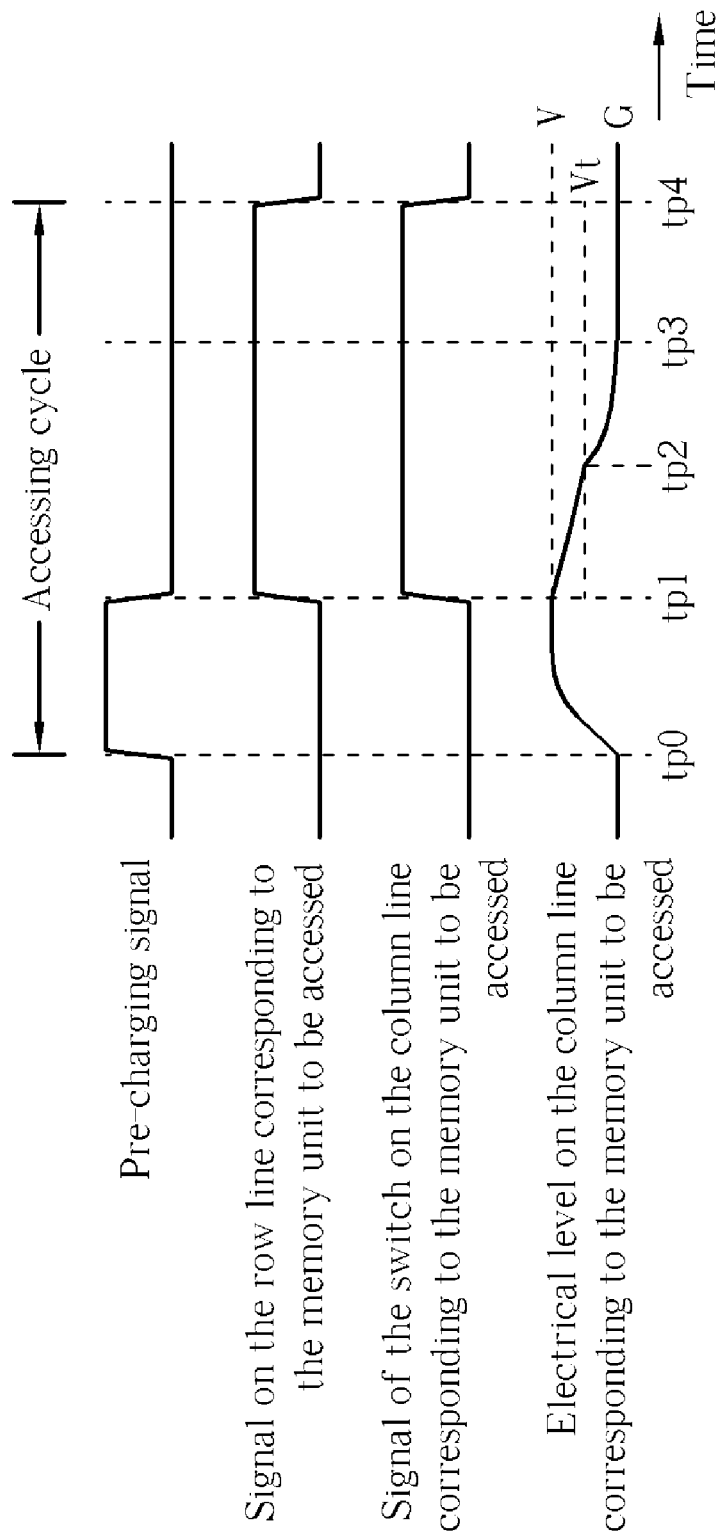
FIG. 2 is a diagram of waveforms of related signals of the memory circuit shown in FIG. 1.

FIG. 2 is a diagram of the waveforms of related signals of the memory circuit 10. The horizontal axis of FIG. 2 represents time whereas the vertical axis represents the voltage level of each signal.

While accessing an objective memory unit of the given column line, a high level pre-charging signal Pre is applied from tp0 to tp1 to conduct all of the pre-charging transistors Ka and to pre-charge all of the column lines. At the same time, the row line and the column line of the objective memory unit are respectively decoded by the row-decoder 14A and the column decoder 14B. Assume that the column line of the objective memory unit is at a low voltage level before tp0, when pre-charging, the voltage level of the given column line (i.e. the drain voltage of the corresponding transistor Ka of the given column line) will steadily increase to the high voltage level (i.e. bias voltage V) at tp1.

At tp1, the pre-charging procedure is completed due to the pre-charging signal Pre is changed to a low voltage level. The row decoder 14A then enables the objective memory unit by a high voltage level through the corresponding row line. The corresponding switch Ks of the given column line is turned on according to a corresponding signal from the column decoder 14B. If the objective memory unit has a transistor, the transistor is turned on to discharge the given column line to a low voltage level after the memory unit is enabled. At tp3, the given column line is steadily at the low voltage level, and the sense amplifier 18 thus reads out the data stored in the objective memory unit according to the voltage level of the given column line. On the contrary, if there is no transistor disposed in the objective memory unit, the voltage level of the given column line is maintained even though the objective memory unit is enabled at tp1. Since voltage level of the given column line is at the high voltage level, the inverter Kc of the given column line conducts the corresponding transistor Kb by a low voltage level, therefore, the transistor Kb is functioned as a holding circuit to maintain the high voltage level of the given column line.

However, if there is a transistor disposed in the objective memory unit, the holding circuit will work against the transistor and the access time is then increased. As shown in FIG. 2, if the given column line of the objective memory unit with a transistor is discharged from tp1, at this time, the voltage level of the given column line is still at high voltage level thus the corresponding transistor Kb is conducted. In such case, the drain of the transistor Kb is maintained at the high voltage level and work against the discharging of the objective memory unit. Therefore, at the beginning of tp1, the decreasing rate of the voltage level of the given column line is slower, and the discharging time of the given column line is increased. After the voltage level of the given column line is dropped to voltage level Vt (i.e. the threshold voltage of the inverter Kc), the corresponding inverter Kc turns off the corresponding transistor Kb by a high voltage level biased to the gate of the transistor Kb. Due to the conflicting voltage activity between the transistor deposed in the memory unit and the holding circuit, the discharging time is increased, thus the access time of the memory circuit 10 is relatively long, which leads to a low memory accessing efficiency. Furthermore, during the pre-charging, a great mount of power is consumed due to all of the column lines of the memory circuit 10 being pre-charged.

Figure 3:
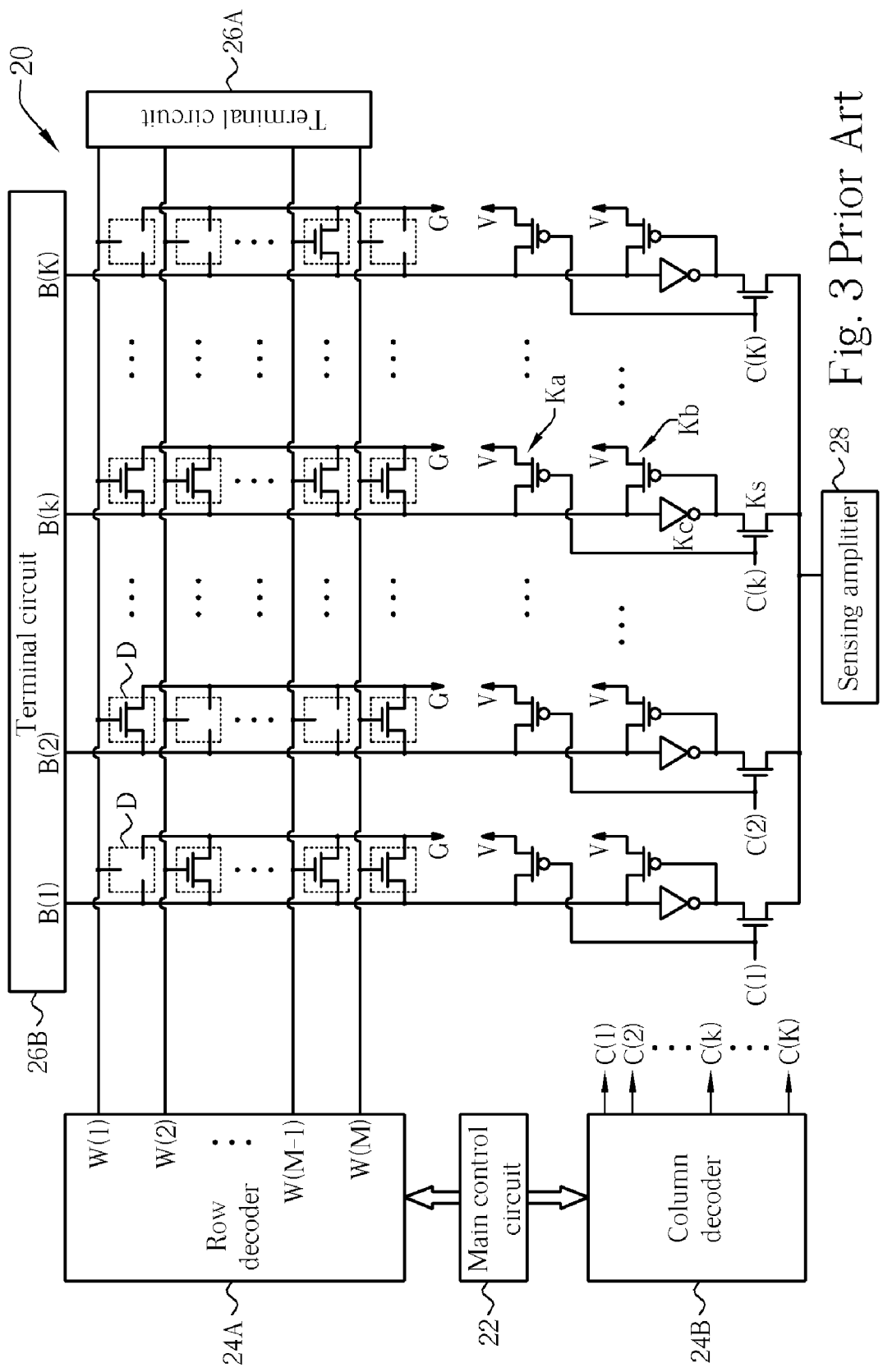
FIG. 3 is a diagram of another conventional memory circuit.

Please refer to FIG. 3, which is a diagram of another memory circuit 20. Similar with the memory circuit 10 shown in FIG. 1, the memory circuit 20 includes row lines W(1)~W(M) and column lines B(1)~B(K) arrange in an array to form a memory circuit 20. Memory units D are respectively existed in the intersection of a corresponding column line B(1)~B(K) and a corresponding row line W(1)~W(M) in the memory circuit 20 for storing data according to whether a transistor is presented or not.

The memory circuit 20 further includes a mastering circuit 22, a row decoder 24A, a column decoder 24B, two terminal circuits 26A and 26B, and a sense amplifier 28. The transistors Ka are provided for respectively pre-charging the corresponding column lines B(1)~B(K). The holding circuits are respectively formed by a transistor Kb and an inverter Kc, and switches Ks, for example: transistors, respectively determine whether the voltage level of the corresponding column line is sensed by the sense amplifier 28. Comparing with the memory circuit 10, the column line of the memory circuit 20 is pre-charged by the corresponding transistor Ka according to whether the corresponding switch Ks is conducted or not.

When accessing an objective memory unit of a given column line, the corresponding pre-charging transistor Ka pre-charges the given column line till the corresponding switch Ks of the given column line is conducted, then the voltage level of the given column line is changed or maintained according to the data stored in the objective memory unit. That is to say, the memory circuit 20 shown in FIG. 3 also has to pre-charge all the column lines simultaneously. Similarly, a conflicting voltage activity effect also exists, so the memory accessing efficiency of the memory circuit 20 is also low. Another defect of the memory circuit 20 is that the un-accessed memory units are enabled and consumes lots of power. For example, if the objective memory unit deposed on the intersection of the column line B(1) and the row line W(1) is accessed, when the corresponding transistor Ks of the given column line B(1) is turned on, the other transistor Ka except the transistor Ka of the given column line B(1) are conducted to respectively maintain the corresponding column lines B(2)-B(K) at its high voltage levels. If these un-accessed memory units deposed on the intersections of the row line W(1) and the column lines B(2)~B(K) have transistors biased at a low voltage level which will conduct a dc current between the high voltage level and the low voltage level and consume power all the time.

The present invention provides a memory circuit 30 biased between a high voltage level V and a low ground voltage G. The present invention also provides a selective discharging mechanism and an auxiliary modules for decreasing power consumption and enhancing accessing efficiency.

Figure 4:
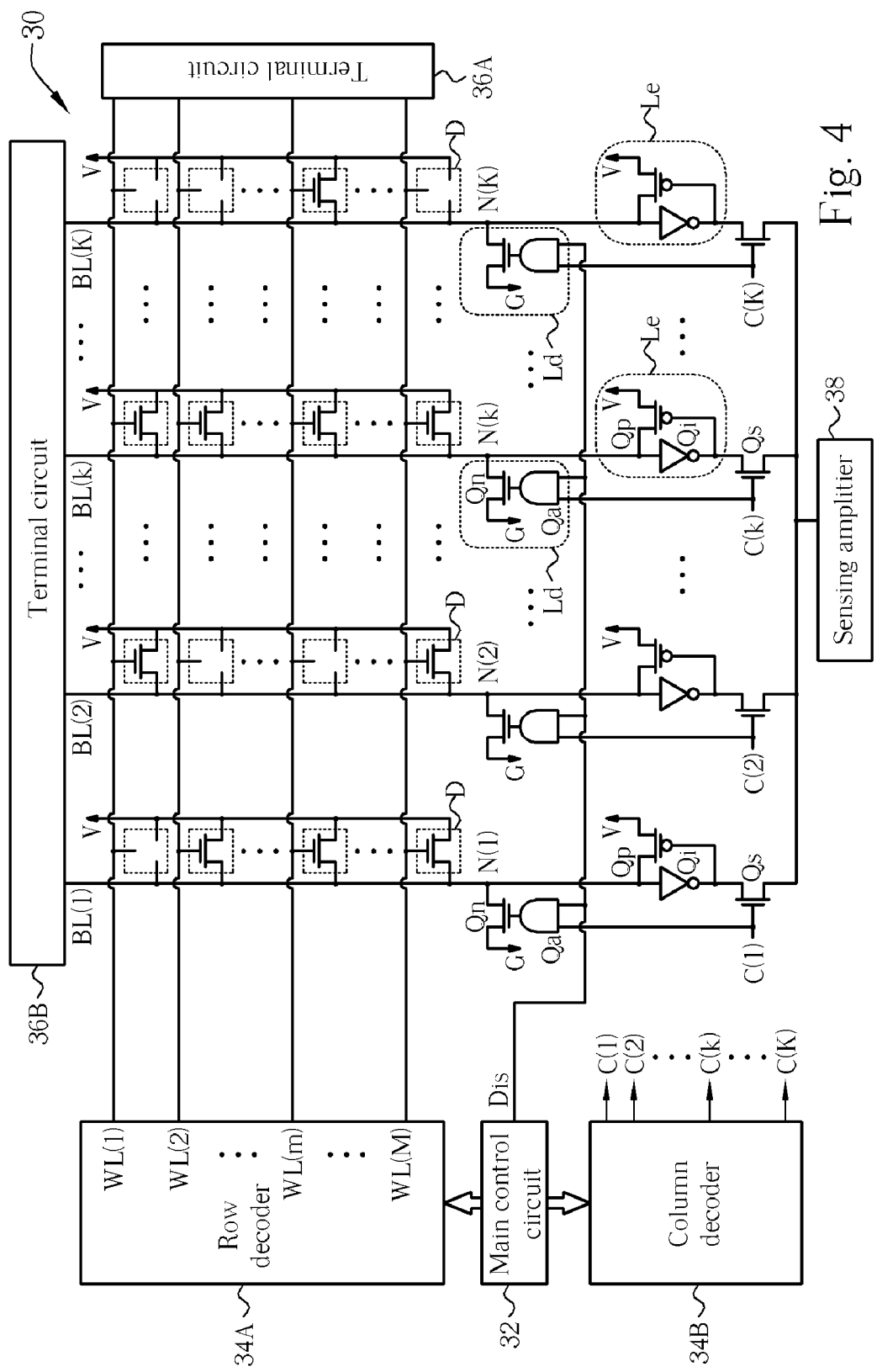
FIG. 4 is a diagram of a memory circuit of the present invention.

Please refer to FIG. 4, which is a diagram shown a memory circuit 30 of the present invention. The memory circuit 30 may be a read-only memory and is biased between a high voltage level V (e.g. a positive bias voltage VDD), and a low ground voltage G. The memory circuit 30 includes at least one memory unit D, which are arranged in an array by intersecting at least one column lines (or the bit lines) BL(1)~BL(K) and at least one row lines (or the word lines) WL(1)~WL(M). Data of each memory unit D are respectively programmed depending on whether an N-type metal oxide semiconductor transistor existed or not. For example, data of a memory unit without a transistor is "1", whereas data of a memory unit with a transistor is "0". In one embodiment, the transistors in each memory unit D of the memory circuit 30 are respectively biased at a high voltage level V. As shown in FIG. 4, the gate of the transistor in the memory unit D is connected to a corresponding word line (row line), and the drain of the transistor is connected to a corresponding bit line (column line), and the source of the transistor is biased at the voltage level V.

The memory circuit 30 further includes a mastering circuit 32, a row decoder 34A, a column decoder 34B, two terminal circuits 36A and 36B, and a sense amplifier 38. Otherwise, each column line has a corresponding auxiliary module Le, a discharging module Ld, and a transistor utilized as a switch Qs. The mastering circuit 32 coordinates the operations of the memory circuit 30, for example, the mastering circuit 32 provides a discharging signal Dis to control the operations of the column lines. The terminal circuits 36A and 36B include dummy cells, impedance matching circuits, and/or bias circuits, etc.

While accessing an objective memory unit of a given address, the row decoder 34A and the column decoder 34B respectively decode the given address for obtaining a given row line and a given column line corresponding to the objective memory unit. The row decoder 34A enables the objective memory unit through the given row line, so that the voltage level of the given column line of the objective memory unit is changed or maintained according to the data stored therein. The voltage level of the column line represents the voltage level between the given column line and the objective memory unit, e.g. the voltage level of column line BL(k) represents the voltage level at the node N(k).

After the column decoding, the column selective signals C(1)~C(K) are generated to respectively control the corresponding switches Qs of the column lines BL(1)~BL(K). The switch Qs can be implemented by an N-type metal oxide semiconductor transistor. The drain of the switch Qs is connected to a corresponding column line whereas the source of the switch Qs is connected to the sense amplifier 38, and the gate of the switch Qs is operated by a corresponding column selective signal C(1)~C(K). For example, while accessing an objective memory unit with a given address, if the corresponding column line of the objective memory unit is the column line BL(k), the switch Qs of the column line BL(k) is conducted by the column selective signal C(k) (while the other switches Qs are turned off.) Therefore, the voltage level of the column line BL(k) is sensed by the sense amplifier 38 via the conducted switch Qs. The sense amplifier 38 thus reads out the data of the objective memory unit by detecting the voltage level of the column line BL(k).

The auxiliary module Le of each column lines BL(1)~BL(K) includes a control unit Qi (i.e. can be implemented with an inverter), and a driving unit Qp (can be implemented with a P-type metal oxide semiconductor transistor). Take the auxiliary module Le of the k-th column line as an example, the control unit Qi enables the driving unit Qp according to the voltage level of the column line BL(k) (i.e., the voltage level of the node N(k)). If the voltage level of the column line BL(k) is higher than a threshold voltage Vt of the control unit Qi (which is regarded as logic "1"), the control unit Qi output logic 0 to conduct the driving unit Qp, and the voltage level of the column line BL(k) is increased to the bias voltage V. On the contrary, if the voltage level of the column line BL(k) is lower than the threshold voltage Vt of the control unit Qi, the control unit Qi outputs logic 1, so that the driving unit Qp is turned off, thus the voltage level of the column line BL(k) is not effected by the driving unit Qp.

The discharging module Ld has a pulling unit Qn (i.e. implemented with an N-type metal oxide semiconductor transistor), and a decision unit Qa (i.e. implemented with an AND gate). Take the discharging module Ld of the k-th column line BL(k) as an example, the decision unit Qa determines whether to enable the pulling unit Qn according to the column selective signal C(k) and the discharging signal Dis. In the embodiment of FIG. 4, when both of the column selective signal C(k) and the discharging signal Dis are logic "1", the decision unit Qa enables the pulling unit Qn. The enabled pulling unit Qn pulls down or maintains the voltage level of the column line BL(k) to the ground voltage. Oppositely, as long as one of the column selective signal C(k) and the discharging signal Dis is logic "0", the pulling unit Qn is disabled, and the voltage level of the column line BL(k) is not affected.

The memory accessing of memory circuit 30 will be described as following. While accessing an objective memory unit D of the column line BL(k), a column selective signal C(k) with logic "1" is set by the column decoder 34B and the switch Qs of the column line BL(k) is then conducted (at the same time, all the other column selective signals are logic "0"). The mastering circuit 32 asserts a discharging signal Dis with logic "1". Since the column selective signal C(k) and the discharging signal are both logic "1", the discharging module Ld of the column line BL(k) then pulls down (or maintains) the voltage level of the column line BL(k) (i.e., the voltage level at the node N(k)) to the ground voltage G. At this time, all the other discharging modules Ld of the other column lines are idle due to the corresponding column selective signals are logic "0". In this manner, only the column line of the objective memory unit will be charged due to both of the discharging signal and the corresponding column selective signal are enabled, the selective discharging mechanism of the present invention is thus achieved. The high power consumption caused by pre-charging all the column lines in the conventional memory circuit is prevented.

After the discharging, the mastering circuit 32 changes the logic level of the discharging signal Dis into logic "0" to disable all of the discharging modules Ld. The row decoder 34A then enables the objective memory unit through the given row line, and the voltage level of the column line BL(k) is depended on the data stored in the objective memory unit (i.e., the presence of a transistor). If the objective memory unit has a transistor, the transistor is conducted to charge the column line BL(k). When the voltage level of the column line BL(k) reaches to a threshold voltage Vt, (i.e. the threshold of the control unit Qi), the auxiliary module Le is enabled, then the control unit Qi of the auxiliary module Le conducts the driving unit Qp. Both the driving unit Qp and the transistor in the objective memory unit pull up the voltage level of the column line BL(k) to a high voltage level such as the bias voltage V. Due to the auxiliary module Le, the voltage level of the column line BL(k) is stable in a short time. If the objective memory unit has no transistors, the voltage level of the column line BL(k) is maintained at a low voltage level such as the ground voltage G. When the voltage level of the column line BL(k) becomes stable, the sense amplifier 38 reads out the data stored in the objective memory unit according to the voltage level of the column line BL(k).

It can be seen that the memory circuit 30 of present invention replaces the holding circuit in the conventional memory circuit with the auxiliary module Le. In the conventional memory circuit, when the objective memory unit has a transistor, the holding circuit works against the charging and the discharging of the transistor in the memory unit, which leads to a low accessing efficiency. In the present memory circuit 30, when the objective memory having a transistor is enabled, the voltage level of the corresponding column line is changed, if the voltage level reaches a threshold voltage level, the auxiliary module enhances the increment of the voltage level of the corresponding column line. Therefore, the memory accessing efficiency of the present memory circuit 30 is improved.

Figure 5:
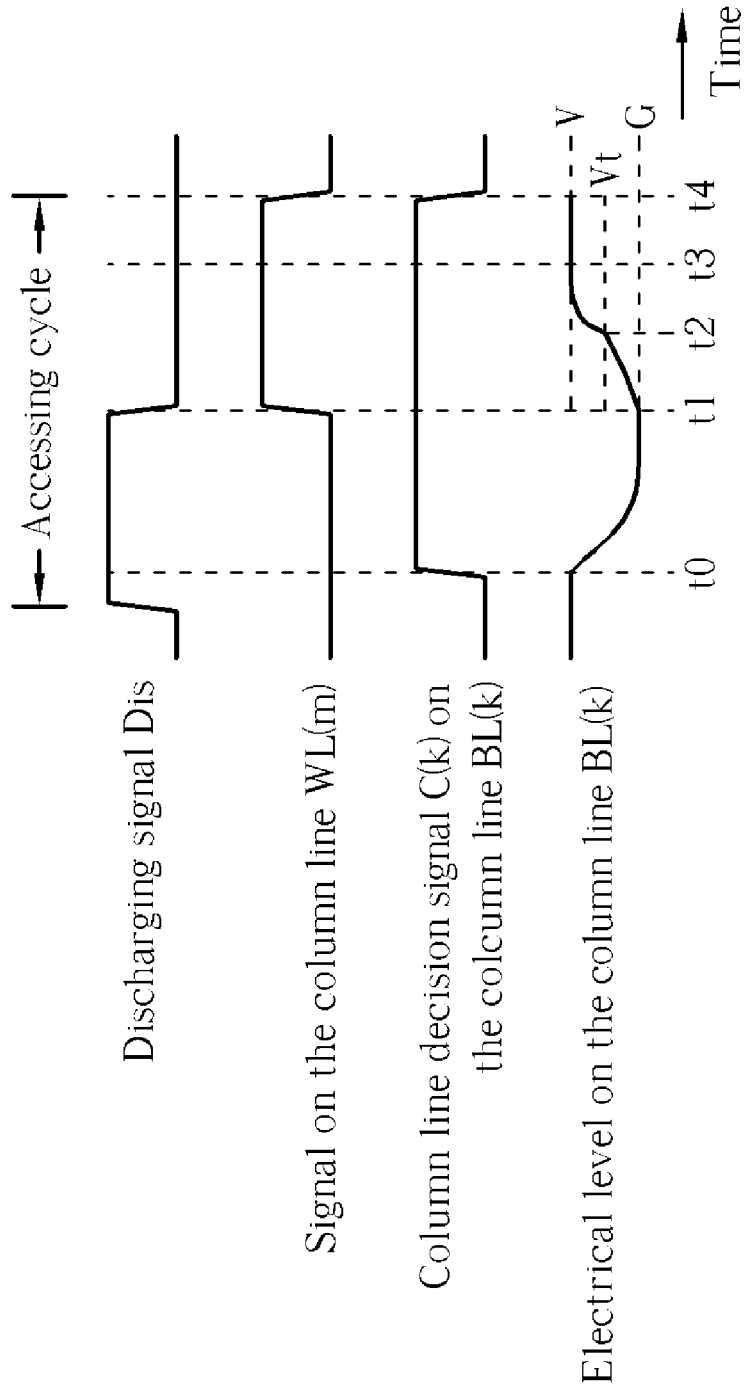
FIG. 5 is a diagram of waveforms of related signals in the memory circuit shown in FIG. 4.

FIG. 5 is a diagram shown the waveforms of related signals in the memory 30 of the present invention. The horizontal axis in FIG. 5 represents time, and the vertical axis in FIG. 5 represents the electrical level. Assume that the objective memory unit is located at the intersection of the row line WL(m) and the column line BL(k). While accessing the objective memory unit, the mastering circuit 32 asserts the discharging signal Dis with logic "1", and the column decoder 34B enables the switch Qs of the column line BL(k) by a column selective signal C(k) with logic "1", thus the discharging module Ld of the column line BL(k) discharges the column line BL(k) at t0. Assume that the initial state of the voltage level of the column line BL(k) is high, the discharging module Ld would discharge the column line BL(k) to a low voltage level such as the ground voltage G from t0 to t1. At t1, the mastering circuit 32 changes the discharging signal Dis to logic "0", the discharging module Ld of the column line BL(k) is disabled. The row decoder 34A enables the objective memory unit with logic "1" through the row line WL(m). If the objective memory unit has a transistor, the transistor will be conducted, and the column line BL(k) is charged from t1 to t2. At t2, the voltage level of the column line BL(k) reaches to a threshold voltage Vt of the corresponding control unit Qi, thus the auxiliary module Le is enabled. Both the auxiliary module Le of the column line BL(k) and the transistor in the objective memory unit charge the column line BL(k) for enhancing the increment of the voltage level of the column line BL(k). When the voltage level of the column line BL(k) is stable, the sense amplifier 38 reads out the data stored in the objective memory unit according to the voltage level of the column line BL(k), and the accessing procedure is completed.

Since only the column line of the objective memory unit is discharged whereas the other column lines are not discharged, the memory circuit 30 of the present invention consumes less power than the convention memory circuit. Moreover, compared with the conventional memory circuit 20 in FIG. 3, since the column lines in the preferred embodiment are selectively discharged, the memory units which wouldn't be accessed wouldn't be conducted, thus that preventing unnecessary power consumption.

In the embodiment of FIG. 5, the initial state of the column line BL(k) is assumed to be at a high voltage level, so the pulling unit Qn in the corresponding discharging module Ld will discharge the column line BL(k). In fact, the initial state of the column line BL(k) depends on the previous accessed memory unit. Assume the previous accessed memory unit of the column line BL(k) has no transistor, the initial state of the column line BL(k) is low. Under this situation, even if the discharging module Ld of the column line BL(k) is enabled, the discharging module Ld does not have to discharge the column line BL(k).

Additionally, when both the driving unit Qp of the auxiliary module Le and the transistor, for example, implementing by a N-type metal oxide semiconductor transistor, in the objective memory unit charge the corresponding column line, even thought the N-type metal oxide semiconductor transistor can't fully charge the voltage level of the column line to the bias voltage V, the driving unit Qp implemented by a P-type metal oxide semiconductor transistor can help. This is another benefit of the auxiliary module Le in the present invention.

In some memories, a hierarchical mechanism is utilized for decoding the column line of the objective memory unit. Such hierarchical mechanism also can be utilized in the present invention.

Figure 6:
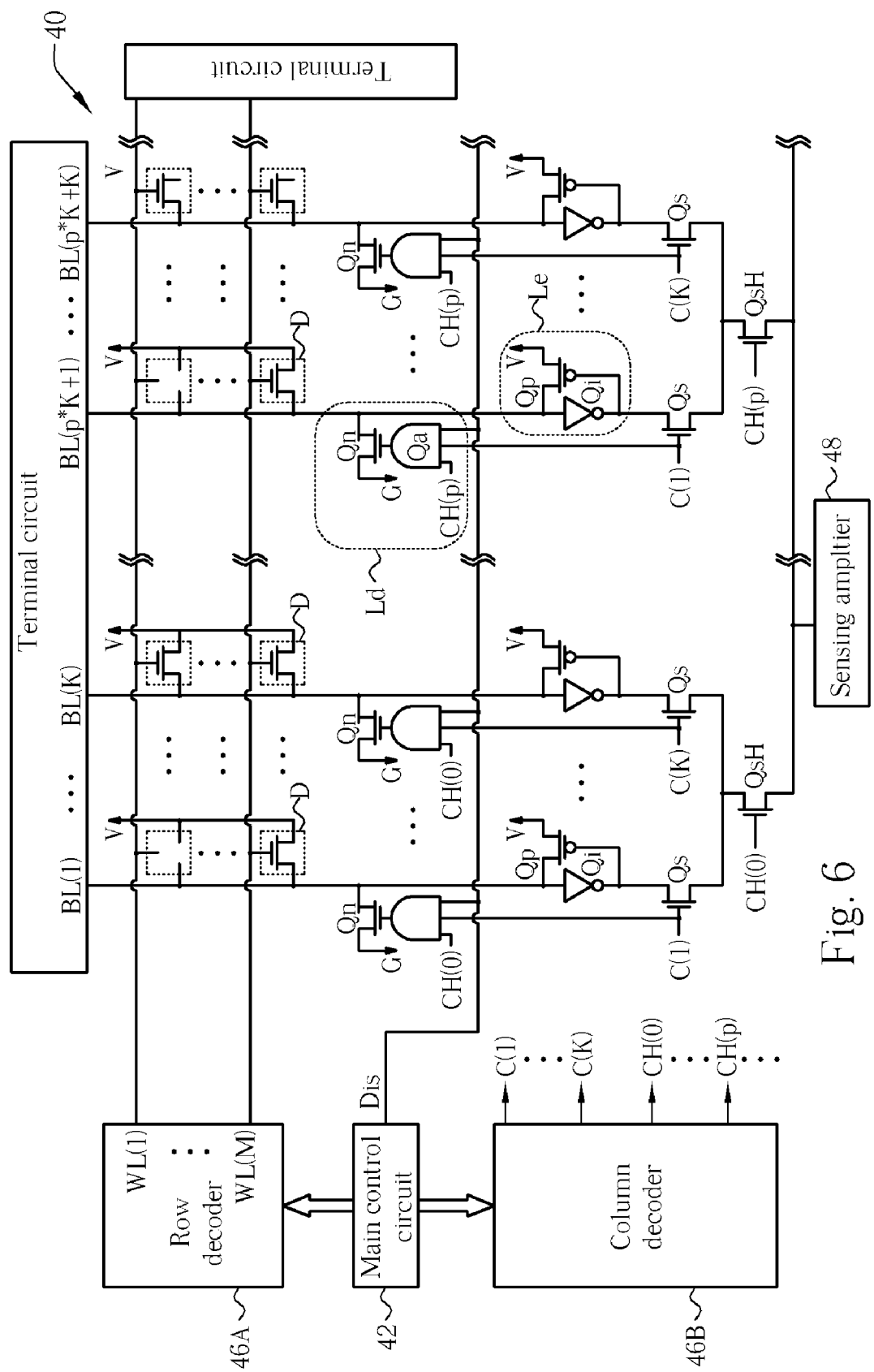
FIG. 6 is a diagram of a memory circuit of the present invention.

FIG. 6 shows a diagram of a memory 40 of the present invention. Similar with the memory 30 shown in FIG. 4, the memory 40 includes at least one memory unit D, which are arranged in an array by at least one column lines BL(1)~BL(K) and at least one row lines WL(1)~WL(M). Similarly, the memory 40 includes a row decoder 46A, a column decoder 46B, and related terminal circuits. A corresponding discharging module Ld and an auxiliary module Le are disposed on each column line.

However, except for a corresponding switch Qs on each column line, an N-type metal oxide semiconductor transistor functioned as a switch QsH is provided and shared by every K column lines for implementing a two levels hierarchical mechanism. Equivalently, every K column lines are regarded as a set. For example, the 0-th set includes column lines BL(1)~BL(K), the 1st set includes column lines BL(K+1)~BL(2*K), and so on. It can be inferred that the k-th column line of the p-th set is the (p*K+k)-th column line of all the column lines. Corresponding to the hierarchical switches Qs and QsH, the column decoder 46B determines a specified set of column lines in accordance with a column selective signal CH(1), CH(2), . . . , or CH(p) and controls the K column lines in the selected set with column selective signals C(1), C(2), . . . , C(K), respectively. The column decoder 46 B performs column pre-decoding to generate the column selective signal C(1), C(2), . . . , C(K), and CH(1), CH(2), . . . , CH(p). While decoding a given column line with certain address, the column decoder 46B decodes that the given column line belongs to the b-th column line of the a-th set. The "a" and "b" present positive integers. For example, while accessing an objective memory unit, and when the column decoder 46B decodes that the objective memory unit belongs to the k-th column line of the p-th set, the column decoder 46B will asserts signals CH(p) and C(k) with logic "1", thereby the voltage level of the corresponding column line is sensed by the sense amplifier 48 through the conducting switches Qs and QsH.

For more compatible with hierarchical mechanism, the discharging module Ld utilized for selective discharging may be presented in other configuration. Take the k-th column line of the p-th set shown in FIG. 6 as an example (i.e. the (p*K+k)-th column line of all the column lines), the decision unit Qa of the corresponding discharging module Ld may be implemented with a AND gate having three inputs, for inputting the signals Dis, CH(p) and C(k) respectively. By this way, the signals Dis, CH(p) and C(k) determine whether to enable the corresponding pulling unit Qn. Therefore, the selective discharging mechanism of the present invention may be implemented in the hierarchical mechanism.

In summary, the selective discharging mechanism provided in the memory circuit 30 and 40 of the present invention consumes less power than the conventional memory circuit. The auxiliary module Le of the present invention overcomes the conflicting voltage activity effect of the conventional memory circuit as well as enhances increment of the voltage level of the column line, therefore improving accessing efficiency of the memory circuit 30 and 40. Moreover, the decision units, the pulling units, the driving units, the control units, and the switches of the memory in the preferred embodiment may be implemented with various circuits. For example, as shown in FIG. 4, the switch Qs is implemented with an N-type metal oxide semiconductor transistor, or the switch Qs may also be implemented with a transmission gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A selective discharging memory circuit comprising:
   a plurality of memory units arranged in an array, wherein each memory unit has a corresponding row line and column line;
   a plurality of discharging modules connected to the corresponding column line, each discharging module receiving a discharging signal and a column selective signal and each discharging module comprising a pulling unit and a decision unit, wherein the decision unit determines whether to discharge the column line through the pulling unit according to the discharging signal and the column selective signal of the column line and for each discharging module of the plurality of discharging modules, the selective discharging memory circuit further comprising:
   an auxiliary module connected to the discharging module for enhancing an increase of the voltage level of the column line after an objective memory unit is enabled by a row decoder and upon the voltage level of the column line reaching a threshold voltage of a control unit of the auxiliary module;
   a switch connected to the auxiliary module; and
   a sense amplifier connected to the switch;
   while the objective memory unit is selected out of the plurality of memory units for accessing, both of the discharge signal and the column selective signal of the objective memory unit are enabled for discharging the objective memory unit; after the objective memory unit is discharged, the discharge signal is disabled and the row line of the objective memory unit is enabled, the column line of the objective memory unit, as a result, is charged to a determined voltage by the help of the auxiliary module of the objective memory unit; then the sense amplifier reads out the value of the objective memory unit.

2. The circuit of claim 1 further comprising:
   a mastering circuit for generating the discharging signal; a column decoder connected to the mastering circuit for decoding the column line of the objective memory unit and enabling the corresponding column selective signal of the column line;
   wherein the row decoder is connected to the mastering circuit for decoding the row line of the objective memory unit and enabling the memory unit through the row line of the objective memory unit.

3. The memory circuit of claim 1, wherein the pulling unit is a NMOS transistor, and the decision unit is a AND gate.

4. The circuit of claim 1 wherein the memory is a read-only memory (ROM).

* * * * *